United States Patent
Lee et al.

(10) Patent No.: US 9,159,854 B2
(45) Date of Patent: Oct. 13, 2015

(54) NANO PARTICLE, NANO PARTICLE COMPLEX HAVING THE SAME AND METHOD OF FABRICATING THE SAME

(75) Inventors: Yu Won Lee, Seoul (KR); Gwang Hei Choi, Seoul (KR); Jin Kyu Lee, Seoul (KR); Yun Ku Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1 day.

(21) Appl. No.: 14/346,215

(22) PCT Filed: Jul. 16, 2012

(86) PCT No.: PCT/KR2012/005661
§ 371 (c)(1),
(2), (4) Date: May 6, 2014

(87) PCT Pub. No.: WO2013/042861
PCT Pub. Date: Mar. 28, 2013

(65) Prior Publication Data
US 2014/0231749 A1     Aug. 21, 2014

(30) Foreign Application Priority Data
Sep. 20, 2011   (KR) ........................ 10-2011-0094912

(51) Int. Cl.
*H01L 29/225* (2006.01)
*H01L 31/0352* (2006.01)
*B22F 1/00* (2006.01)
*C22C 1/04* (2006.01)
*H01L 31/18* (2006.01)
*B82Y 30/00* (2011.01)

(52) U.S. Cl.
CPC ...... *H01L 31/035218* (2013.01); *B22F 1/0018* (2013.01); *B82Y 30/00* (2013.01); *C22C 1/0491* (2013.01); *H01L 31/1828* (2013.01)

(58) Field of Classification Search
CPC ... H01L 29/127; H01L 29/151; H01L 29/225; C09K 11/0811; C09K 11/565; C09K 11/883; B82Y 20/00; B82Y 30/00
See application file for complete search history.

(56) References Cited

U.S. PATENT DOCUMENTS

| 2007/0197003 | A1* | 8/2007 | Yen et al. ....................... 438/479 |
| 2010/0068522 | A1 | 3/2010 | Pickett et al. |
| 2010/0084629 | A1 | 4/2010 | Park et al. |

(Continued)

FOREIGN PATENT DOCUMENTS

| CN | 1610062 A | 4/2005 |
| CN | 1687304 A | 10/2005 |

(Continued)

OTHER PUBLICATIONS

Liu, Z. et al. "Blue-Green Luminescent CdZnSeS Nanocrystals Synthesized with Activated Alkrl Thiol" Sciencepaper online, Division of Materials Science 2011. Jan. 12, 2011.

(Continued)

*Primary Examiner* — Matthew W Such
*Assistant Examiner* — Scott Stowe
(74) *Attorney, Agent, or Firm* — Saliwanchik, Lloyd & Eisenschenk

(57) ABSTRACT

Disclosed are a nano particle, a nano particle complex and a method of fabricating the nano particle. The nano particle includes a compound semiconductor having a first metal element and a second metal element. The property of the nano particle is readily controlled depending on the composition of the first and second metal elements.

9 Claims, 7 Drawing Sheets

(56) References Cited

U.S. PATENT DOCUMENTS

2010/0140586 A1\* 6/2010 Char et al. ............ 257/14
2010/0289003 A1 11/2010 Kahen et al.

FOREIGN PATENT DOCUMENTS

| | | |
|---|---|---|
| CN | 101787271 A | 7/2010 |
| JP | 2010-090356 A | 4/2010 |
| KR | 10-2011-0044280 A | 4/2011 |

OTHER PUBLICATIONS

Zhengtao D. et al. "Band Gap Engineering of Quaternary-Alloyed ZnCdSSe Quantum Dots via a Facile Phosphine-Free Colloidal Method" Journal of the American Chem Society. vol. 131:49, pp. 17744-17745, 2009.

Ouyang, J. et al. "Gradiently Alloyed $Zn_x, Cd_{1-x}S$ Colloidal Photoluminescent Quantum Dots Synthesized via a Noninjection One-Pot Approach" J Phys. Chem. C. 2008, vol. 112, pp. 4908-4919.

Aldeek, F. et al. "Enhanced Photostability from CdSe(S)/ZnO Core/Shell Quantum Dots and Their Use in Biolabeling" Eur. J. Inorg. Chem. Feb. 2011, vol. 2011, Issue 6, pp. 794-801.

International Search Report in International Application No. PCT/KR2012/005661, filed Jul. 16, 2012.

Notice of Allowance dated Dec. 27, 2013 in Korean Application No. 10-2011-0094912.

Office Action dated Jul. 9, 2013 in Korean Application No. 10-2011-0094912.

Office Action dated Dec. 3, 2013 in Taiwanese Application No. 101128782.

\* cited by examiner

Fig. 6
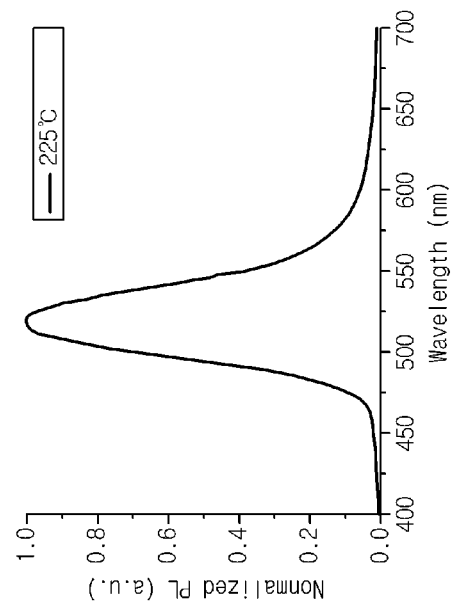
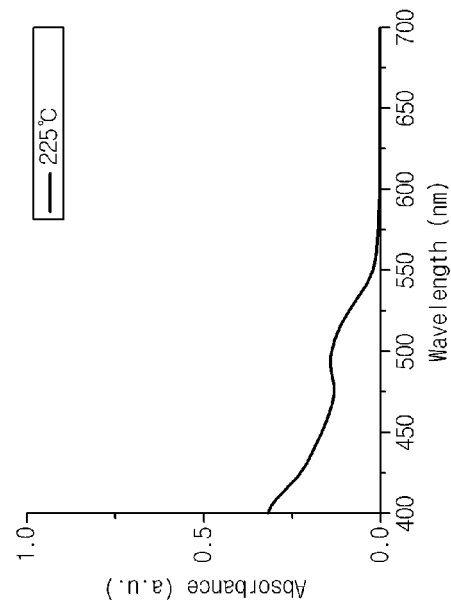

Fig. 7
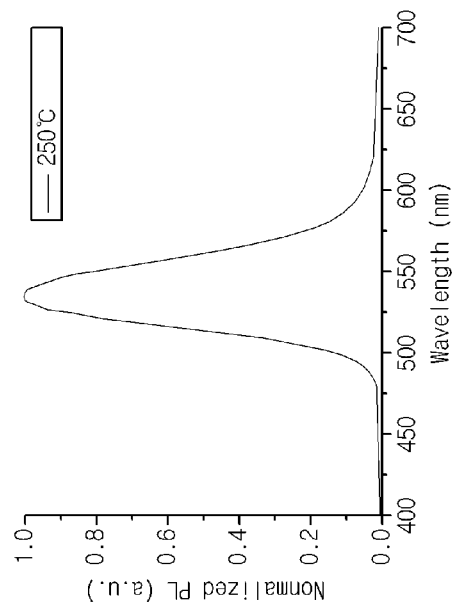
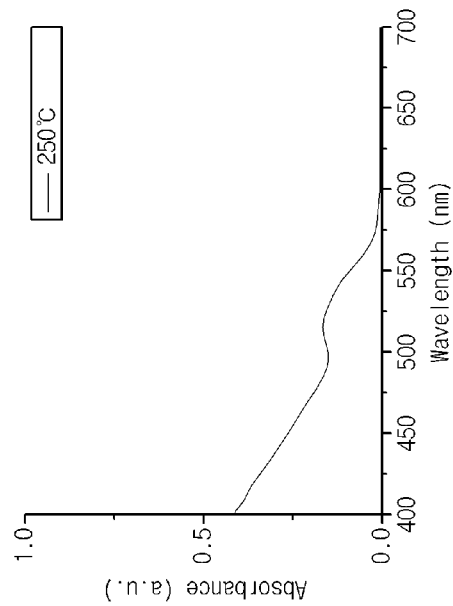

NANO PARTICLE, NANO PARTICLE COMPLEX HAVING THE SAME AND METHOD OF FABRICATING THE SAME

CROSS-REFERENCE TO RELATED APPLICATIONS

This application is the U.S. national stage application of International Patent Application No. PCT/KR2012/005661, filed Jul. 16, 2012, which claims priority to Korean Application No. 10-2011-0094912, filed Sep. 20, 2011, the disclosures of each of which are incorporated herein by reference in their entirety.

TECHNICAL FIELD

The embodiment relates to a nano particle, a nano particle complex and a method of fabricating the same.

BACKGROUND ART

According to the related art, quantum dots are fabricated through a dry chemical scheme, in which the quantum dots are fabricated by using a metal organic chemical vapor deposition (MOCVD) based on the lattice mismatch with respect to a substrate prepared under the vacuum state. The dry chemical scheme has the advantage in that nano particles formed on the substrate can be simultaneously arranged and observed. However, the dry chemical scheme requires expensive synthesis equipment and makes it difficult to synthesize the quantum dots having the uniform size in large quantity. In order to solve the above problem, a wet chemical scheme has been developed, in which the quantum dots having the uniform size are synthesized by using a surfactant.

According to the wet chemical scheme for fabricating the quantum dots, the nano particles are prevented from being conglomerated by the surfactant and the adsorption degree between the crystal surface of the nano particle and the surfactant is adjusted to synthesize the quantum dots having the uniform size and various shapes. In 1993, Bawendi Group has succeeded, for the first time in the world, the synthesis of CdSe quantum dots having the uniform size through the wet chemical scheme by using tri-octylphosphineoxide (TOPO) and trioctylphosphine (TOP) as surfactants and dimethylcadmium ($(Me)_2Cd$) and selenium as semiconductor precursors. In addition, Alivisators Group has developed a method of synthesizing CdSe quantum dots in a more safety manner by using hexadecylamine (HDA), trioctylphosphineoxide, and tri-octylphosphine as surfactants and cadmium oxide (CdO) and selenium as semi-conductor precursors.

Thereafter, various studies and research have been pursued to form a shell on a surface of CdSe by using a semiconductor compound having a higher bandgap in order to improve the light emission characteristic of the quantum dots and to enhance the photo stability and environmental stability. For instance, the semiconductor compound includes CdSe/ZnS, CdSe/ZnSe, CdSe/CdS, and ZnSe/ZnS (see, Korean Patent Registration No. 10-0376405).

However, in the case of the quantum dot having the core/shell structure, if the shell is thick, an interfacial surface may become unstable due to the lattice mismatch between a core semiconductor material and a shell semiconductor material, so the quantum efficiency may be lowered. For this reason, the shell is fabricated in a thin thickness. Therefore, although the shell material can stabilize the surface state of the core quantum dot, it may not transfer electrons and holes to the core after absorbing light, so there are limitations in terms of the light efficiency and photo stability of the quantum dot and the environmental stability.

DISCLOSURE OF INVENTION

Technical Problem

The embodiment provides a nano particle complex having the improved efficiency and stability and a method of fabricating the same.

Solution to Problem

A nano particle according to the embodiment includes a compound semiconductor including a first metal element and a second metal element.

According to one embodiment, the first and second metal elements are group II elements.

According to one embodiment, a content of the first metal element is gradually reduced from a center to an outer portion of the nano particle, and a content of the second metal element is gradually increased from the center to the outer portion of the nano particle.

According to one embodiment, the compound semiconductor includes a first group VI element and a second group VI element.

According to one embodiment, the first metal element is cadmium, the second metal element is zinc, the first group VI element is selenium, and the second group VI element is sulfide.

According to one embodiment, the compound semiconductor is expressed as following chemical formula 1, $$A_X B_{1-X} C_Y D_{1-Y} \quad \text{chemical formula 1}$$

wherein A is a group II element, B is another group II element different from A, C is a group VI element, and D is another group VI element different from C ($0<X<1$, $0<Y<1$).

According to one embodiment, the A is cadmium, the B is zinc, and X is gradually reduced from a center to an outer portion of the nano particle.

According to one embodiment, the nano particle has a diameter of about 2 nm to about 8 nm and converts a light having a wavelength of about 300 nm to about 400 nm to a light having a wavelength of about 500 nm to about 600 nm.

A nano particle complex according to the embodiment includes a nano particle including a compound semiconductor of at least two metals.

According to one embodiment, the compound semiconductor is a group II-VI compound semiconductor.

According to one embodiment, the nano particle complex further includes a protective layer surrounding the nano particle.

According to one embodiment, the protective layer includes a metal oxide.

According to one embodiment, the nano particle is comprised of the compound semi-conductor.

A method of fabricating a nano particle according to the embodiment includes the steps of mixing a first metallic precursor with a second metallic precursor; reacting the first metallic precursor with the second metallic precursor; and forming a compound semiconductor including a first metal element derived from the first metallic precursor and a second metal element derived from the second metallic precursor.

According to one embodiment, the method further includes the steps of forming a reaction solution including the first metallic precursor and the second metallic precursor; and increasing a temperature of the reaction solution.

According to one embodiment, the temperature of the reaction solution is increased in a range of about 50° C. to about 400° C.

According to one embodiment, the first and second metallic precursors include hydroxide.

According to one embodiment, the first and second metal elements are group II elements.

According to one embodiment, the reaction solution includes a nucleophillic catalyst.

According to one embodiment, the nucleophillic catalyst is selected from the group consisting of amine and phosphine.

Advantageous Effects of Invention

The nano particle according to the embodiment includes the compound semi-conductor having at least two types of metal elements. Thus, the nano particle according to the embodiment can properly adjust the bandgap energy depending on the composition of each metal. That is, the nano particle according to the embodiment can freely adjust the bandgap energy regardless of the diameter thereof. Therefore, the nano particle according to the embodiment can generate the light having the long wavelength even if the nano particle has the large diameter.

In addition, according to the nano particle of the embodiment, the composition of metal elements having higher reactivity is gradually increased in the direction of the center of the nano particle and the composition of metal elements having lower reactivity is gradually increased in the direction of the outer portion of the nano particle. Thus, the nano particle according to the embodiment may have the higher stability. That is, the nano particle according to the embodiment may have the higher stability even if the nano particle has the single particle structure.

Therefore, the nano particle according to the embodiment may have the desired diameter to convert the incident light into the light having the desired wavelength, so the light conversion efficiency can be improved. In addition, the nano particle according to the embodiment may have the higher stability. Since the nano particle according to the embodiment has the simple structure similar to the structure of the single particle, the light efficiency can be improved.

BRIEF DESCRIPTION OF DRAWINGS

FIGS. 5 to 10 are views showing intensity of light having the wavelength converted by a nano particle according to experimental example 1 to 6.

MODE FOR THE INVENTION

Hereinafter, a nano particle according to the embodiment will be described in detail with reference to accompanying drawings.

Figure 1:
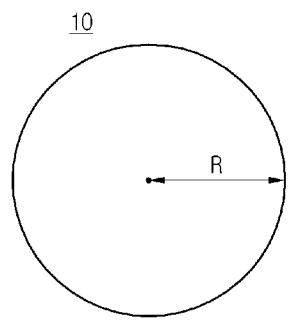
FIG. 1 is a view showing a nano particle according to the embodiment.
Figure 2:
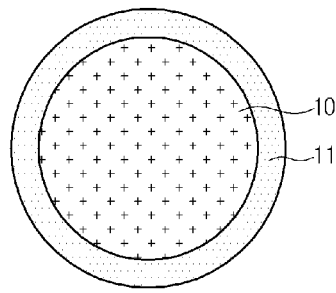
FIG. 2 is a view showing a nano particle complex according to another embodiment.
Figure 3:
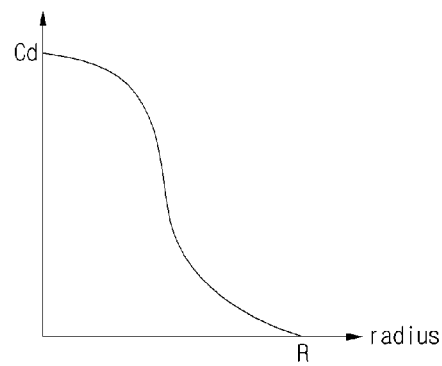
FIG. 3 is a graph showing a composition of cadmium in a nano particle according to the embodiment.
Figure 4:
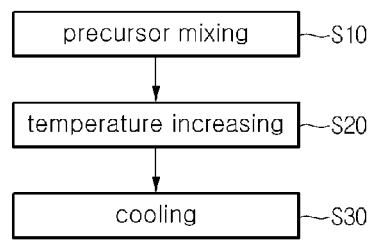
FIG. 4 is a block diagram showing a method of fabricating a nano particle according to the embodiment.

FIG. 1 is a view showing a nano particle according to the embodiment, FIG. 2 is a view showing a nano particle complex according to another embodiment, FIG. 3 is a graph showing a composition of cadmium in the nano particle according to the embodiment, and FIG. 4 is a block diagram showing a method of fabricating the nano particle according to the embodiment.

The nano particle according to the embodiment may include a compound semi-conductor including a first metal element and a second metal element. The first and second metal elements may be group II elements. That is, the first metal element is a first group II element and the second metal element is a second group II element different from the first group II element. In addition, the compound semiconductor may include at least two types of metal elements. That is, the compound semi-conductor may include a third metal element. The compound semiconductor may include various types of metal elements.

In addition, the compound semiconductor may include a group VI element. That is, the compound semiconductor may be a group II-VI element. In detail, the compound semiconductor may include a first group VI element and a second group VI element different from the first group VI element.

The first and second metal elements may include one selected from the group consisting of Cd, Zn, Pb and Hg, but the embodiment is not limited thereto. In addition, the first group VI element and the second group VI element may include one selected from the group consisting of S, Se and Te.

The compound semiconductor can be expressed as following chemical formula 1.

$$A_X B_{1-X} C_Y D_{1-Y}$$ <span style="float:right">chemical formula 1</span>

In the above chemical formula, A is a group II element, B is another group II element different from A, C is a group VI element, and D is another group VI element different from C (0<X<1, 0<Y<1). In detail, A is cadmium and B is zinc.

In more detail, the first metal element is cadmium, the second metal element is zinc, the first group VI element is selenium, and the second group VI element is sulfide. That is, the compound semiconductor is a CdZnSeS compound semiconductor.

As shown in FIG. 1, the nano particle 10 according to the embodiment may have the single particle structure. That is, the nano particle 10 according to the embodiment may have the single-layer structure other than the multi-layer structure. In detail, the nano particle 10 according to the embodiment may consist of the compound semiconductor as a whole.

In addition, as shown in FIG. 2, a protective layer 11 is disposed around the nano particle 10. The protective layer 11 surrounds the nano particle 10. The protective layer 11 is deposited on an outer surface of the nano particle 10. That is, the protective layer 11 can be deposited on the outer surface of the nano particle 10. In detail, the protective layer 11 is directly formed on the outer surface of the nano particle 10. The protective layer 11 is coated on the outer surface of the nano particle 10. The protective layer 11 is coated on the entire area of the outer surface of the nano particle 10.

Thus, the nano particle complex is formed by the nano particle 10 and the protective layer 11. That is, the nano particle complex may have the core/shell structure.

The protective layer may include a group II-VI compound. For instance, the protective layer may include CuZnS, CdSe, CdTe, CdS, ZnSe, ZnTe, ZnS, HgTe or HgS.

The protective layer includes metal oxide. In detail, the protective layer consists of the metal oxide. The metal oxide may be an oxide of the first metal element or the second metal element. In addition, the metal oxide may be an oxide of the group II element. For instance, the metal oxide is a cadmium oxide or a zinc oxide.

The metal oxide may be an oxide of a metal different from the first and second metal elements. For instance, the metal oxide can be selected from the group consisting of a tin oxide, an aluminum oxide and a titanium oxide.

The protective layer can be formed through the deposition process. In order to form the protective layer, the nano particles are uniformly dispersed in the solvent. The solvent may include an organic solvent. For instance, the solvent may include 1-octadecene, toluene or trioctylphosphine oxide.

After that, an organometallic compound is added to the solvent where the nano particles are dispersed to form the protective layer. The organometallic compound is a source of metal oxide used as the protective layer. The amount of the organometallic compound added to the solvent can be variously adjusted depending on the amount of the nano particles mixed in the solvent and the thickness of the protective layer.

The organometallic compound may have the direct bonding structure of metal and oxygen. In detail, the organometallic compound may include carboxylate or alkoxide. That is, the organometallic compound is the metallic salt of carboxyl acid or alcohol.

For instance, the organometallic compound includes a metallic complex compound of acetic acid, oleic acid, stearic acid, myristic acid or lauric acid. At this time, the metal included in the organometallic compound may include the group II element. In addition, the metal included in the organometallic compound may include Al, Sn or Ti.

The content of the first and second metal elements may vary depending on the position of the nano particle according to the embodiment. That is, the composition of the compound semiconductor may vary depending on the position of the nano particle according to the embodiment. In detail, the nano particle includes the first metal element and the second metal element and the composition of the first and second metal elements may vary about the radial direction of the nano particle.

For instance, the content of the first metal element may be gradually reduced from the center to the outer portion of the nano particle. In addition, the content of the second metal element may be gradually increased from the center to the outer portion of the nano particle.

In detail, in above chemical formula 1, the value of X may be gradually reduced from the center to the outer portion of the nano particle.

In more detail, if the first metal element is cadmium, as shown in FIG. 3, the composition of cadmium may be gradually reduced from the center to the outer portion of the nano particle.

In other words, if the compound semiconductor is the CdZnSeS compound semi-conductor, the composition of the cadmium is significantly higher than the composition of the zinc at the center of the nano particle. In addition, the composition of the cadmium is significantly lower than the composition of the zinc at the outer portion of the nano particle. The composition of the cadmium may be nonlinearly reduced according to the distance from the center of the nano particle. In particular, the composition of the cadmium may be reduced from the center to the outer portion of the nano particle such that at least two inflection points can be formed.

Referring to FIG. 4, in order to form the nano particle according to the embodiment, at least two types of metallic precursors and at least one precursor of the group VI element are added to the solvent.

The solvent may include an organic solvent, such as 1-octadecene, toluene or tri-octylphosphine oxide, but the embodiment is not limited thereto.

The metallic precursor includes first and second metallic precursors. For instance, the metallic precursor may be a group II metallic precursor. In detail, the metallic precursor may include alkylcarboxylic acid metal complex. For instance, the metallic precursor may include a metallic complex compound of oleic acid, stearic acid, myristic acid or lauric acid. In particular, the metallic precursor may include Cd metallic complex compound or Zn metallic complex compound of alkylcarboxylic acid. Further, the metallic precursor may be hydroxide of the metal. For instance, the metallic precursor may include $Cd(OH)_2$, CdO, $Zn(OH)_2$ or ZnO.

The first metallic precursor may include Cd and the second metallic precursor may include Zn. For instance, the first metallic precursor may include Cd metallic complex compound of alkylcarboxylic acid, $Cd(OH)_2$, or CdO. In addition, the second metallic precursor may include Zn metallic complex compound of alkylcarboxylic acid, $Zn(OH)_2$ or ZnO.

The precursor of the group VI element may include the compound of the group VI element. In detail, the precursor of the group VI element may include the compound of Se, S or Te. For instance, the precursor of the group VI element may include tri-octylphosphine selenium (TOPSe), trioctylphosphine sulfide (TOPS), tri-octylphosphine tellurium (TOPTe), tributylphosphine selenium (TBPSe), tributylphosphine sulfide (TBPS), tributylphosphine tellurium (TBPTe), triisopropylphosphine selenium (TPPSe), triisopropylphosphine sulfide (TPPS) or triisopropylphosphine tellurium (TPPTe), but the embodiment is not limited thereto.

A surfactant may be added to the reaction solution.

In addition, the reaction solution may further include a nucleophillic catalyst. The nucleophillic catalyst adjusts the reaction rate in the reaction solution. The nucleophillic catalyst may include amine or phosphine. In detail, the nucleophillic catalyst may include alkylamine or alkylphosphin. In more detail, the nucleophillic catalyst may include hexylamine, octylamine, dihexylamine, dioctylamine, oleylamine, dioctylphosphine, trioctylphosphine or water.

After that, the reaction solution is heated. The heating rate for the reaction solution is in the range of about 20° C./min to about 30° C./min. In addition, the reaction solution may be heated up to about 50° C. to about 400° C. in the normal temperature. In detail, the reaction solution may be heated up to about 180° C. to about 310° C.

In addition, the temperature of the reaction solution may rise in the range of about 190° C. to about 230° C. The temperature of the reaction solution may rise in the range of about 220° C. to about 230° C. The temperature of the reaction solution may rise in the range of about 245° C. to about 255° C. The temperature of the reaction solution may rise in the range of about 270° C. to about 280° C. The temperature of the reaction solution may rise in the range of about 290° C. to about 310° C.

After the temperature of the reaction solution has been increased to the predetermined level, the temperature of the reaction solution is maintained for about 1 minute to about 15 minutes.

As a result, the nano particle according to the embodiment is fabricated. At this time, the compound semiconductor including the first metal element derived from the first metallic precursor and the second metal element derived from the second metallic precursor can be formed.

In particular, if the first metallic precursor is a Cd compound, and the second metallic precursor is a Zn compound, the rate constant of the Cd is significantly higher than that of Zn. Thus, Cd mainly reacts with S and/or Se in the early stage of the reaction, so the content of Cd is very high at the center of the nano particle. In addition, due to the reaction of Cd, the concentration of the Cd compound is lowered and the reaction rate of the Cd may be lowered. Thus, the composition of the Cd may be gradually lowered and the content of the Zn may be gradually increased from the center to the outer portion of the nano particle.

Then, the reaction solution is cooled down. At this time, the reaction solution may be rapidly cooled down to the normal temperature. For instance, the reaction solution can be cooled down in the rate of about 100° C./min.

The nano particle according to the embodiment includes the compound semi-conductor having at least two types of metal elements. Thus, the nano particle according to the embodiment can properly adjust the bandgap energy depending on the composition of each metal. That is, the nano particle according to the embodiment can freely adjust the bandgap energy regardless of the diameter thereof. Therefore, the nano particle according to the embodiment can generate the light having the long wavelength even if the nano particle has the large diameter.

For instance, the nano particle may have the diameter in the range of about 2 nm to about 8 nm and can convert the incident light having the wavelength of about 300 nm to about 400 nm into the light having the wavelength of about 500 nm to about 600 nm.

In detail, the nano particle may have the diameter in the range of about 2 nm to about 3 nm and can convert the incident light having the wavelength of about 300 nm to about 400 nm into the light having the wavelength of about 500 nm to about 510 nm.

In more detail, the nano particle may have the diameter in the range of about 3 nm to about 4 nm and can convert the incident light having the wavelength of about 300 nm to about 400 nm into the light having the wavelength of about 520 nm to about 530 nm.

In more detail, the nano particle may have the diameter in the range of about 3.5 nm to about 4.5 nm and can convert the incident light having the wavelength of about 300 nm to about 400 nm into the light having the wavelength of about 540 nm to about 550 nm.

In more detail, the nano particle may have the diameter in the range of about 4.5 nm to about 4.5 nm and can convert the incident light having the wavelength of about 300 nm to about 400 nm into the light having the wavelength of about 555 nm to about 565 nm.

In more detail, the nano particle may have the diameter in the range of about 5.5 nm to about 6.5 nm and can convert the incident light having the wavelength of about 300 nm to about 400 nm into the light having the wavelength of about 570 nm to about 580 nm.

In more detail, the nano particle may have the diameter in the range of about 6.5 nm to about 7.5 nm and can convert the incident light having the wavelength of about 300 nm to about 400 nm into the light having the wavelength of about 580 nm to about 590 nm.

In addition, according to the nano particle of the embodiment, the composition of metal elements having higher reactivity is gradually increased in the direction of the center of the nano particle and the composition of metal elements having lower reactivity is gradually increased in the direction of the outer portion of the nano particle. Thus, the nano particle according to the embodiment may have the higher stability. That is, the nano particle according to the embodiment may have the higher stability even if the nano particle has the single particle structure.

Therefore, the nano particle according to the embodiment may have the desired diameter to convert the incident light into the light having the desired wavelength, so the light conversion efficiency can be improved. In addition, the nano particle according to the embodiment may have the higher stability. Since the nano particle according to the embodiment has the simple structure similar to the structure of the single particle, the light efficiency can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Experimental Example #1

Figure 5:
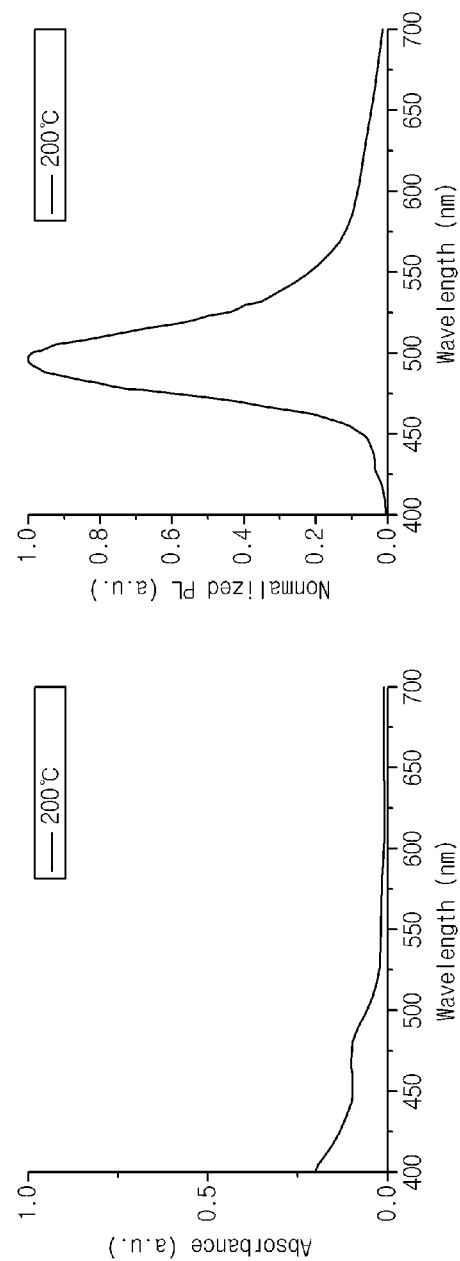

About 0.0439 g (0.3 mmol) of $Cd(OH)_2$, about 0.398 g (4 mmol) of $Zn(OH)_2$, about 5 ml of oleic acid, about 10 ml of 1-octadecene, about 3 ml of trioctylphosphine, about 0.032 g (0.4 mmol) of selenium and about 0.128 g (4 mmol) of sulfide were mixed with each other to form the reaction solution. Then, the reaction solution was heated up to about 200° C. at the rate of 30° C./min. After that, the temperature of the reaction solution was cooled down to the normal temperature and acetone was added to immerse the nano particles therein. Then, the nano particles were separated through the centrifugation. Then, the nano particles were dispersed by hexane and purified by acetone. As a result, the nano particle was obtained. The diameter of the nano particle was about 2 nm to about 3 nm. In the nano particle, the composition of Cd was about 13% and the composition of Zn was about 76%. In addition, the nano particle prepared according to Experimental Example #1 represented the absorbance and light emitting characteristics as shown in FIG. 5. In particular, the nano particle prepared according to Experimental Example #1 represented the wavelength of about 505 nm.

Experimental Example #2

Experimental Example #2 was performed under the same condition of Experimental Example #1 except for the temperature condition. In Experimental Example #2, the reaction solution was heated up to about 225° C. and then cooled. The nano particle was obtained through Experimental Example #2. The diameter of the nano particle was about 3 nm to about 4 nm. In the nano particle, the composition of Cd was about 17% and the composition of Zn was about 72%. In addition, the nano particle prepared according to Experimental Example #2 represented the absorbance and light emitting characteristics as shown in FIG. 6. In particular, the nano particle prepared according to Experimental Example #2 represented the wavelength of about 526 nm.

Experimental Example #3

Experimental Example #3 was performed under the same condition of Experimental Example #1 except for the temperature condition. In Experimental Example #3, the reaction solution was heated up to about 250° C. and then cooled. The nano particle was obtained through Experimental Example #3. The diameter of the nano particle was about 4 nm. In the nano particle, the composition of Cd was about 24% and the composition of Zn was about 60%. In addition, the nano particle prepared according to Experimental Example #3 represented the absorbance and light emitting characteristics as shown in FIG. 7. In particular, the nano particle prepared according to Experimental Example #3 represented the wavelength of about 546 nm.

Experimental Example #4

Figure 8:
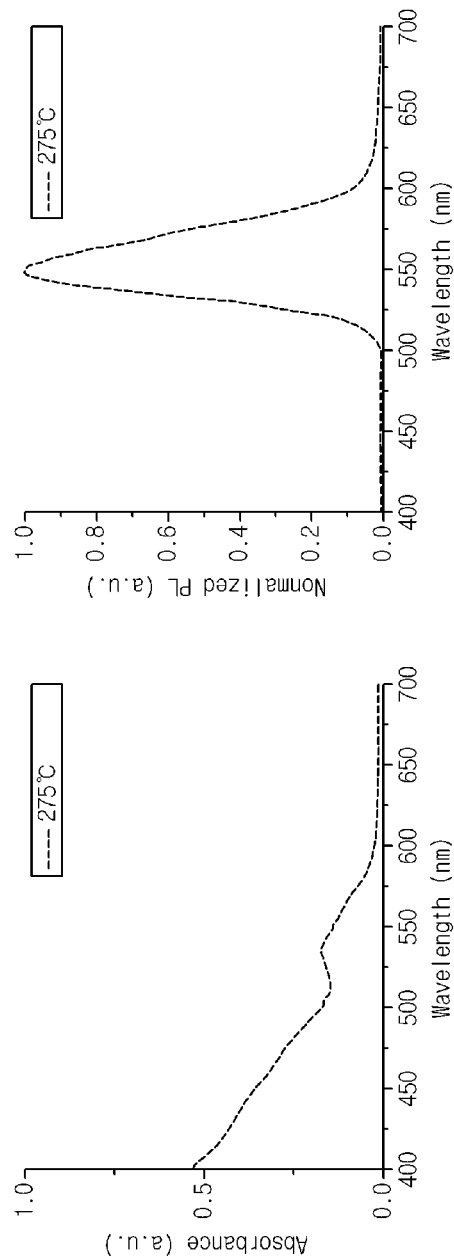

Experimental Example #4 was performed under the same condition of Experimental Example #1 except for the temperature condition. In Experimental Example #4, the reaction solution was heated up to about 275° C. and then cooled. The nano particle was obtained through Experimental Example #4. The diameter of the nano particle was about 5 nm. In the nano particle, the composition of Cd was about 21% and the composition of Zn was about 60%. In addition, the nano particle prepared according to Experimental Example #4 represented the absorbance and light emitting characteristics as shown in FIG. 8. In particular, the nano particle prepared according to Experimental Example #4 represented the wavelength of about 560 nm.

Experimental Example #5

Figure 9:
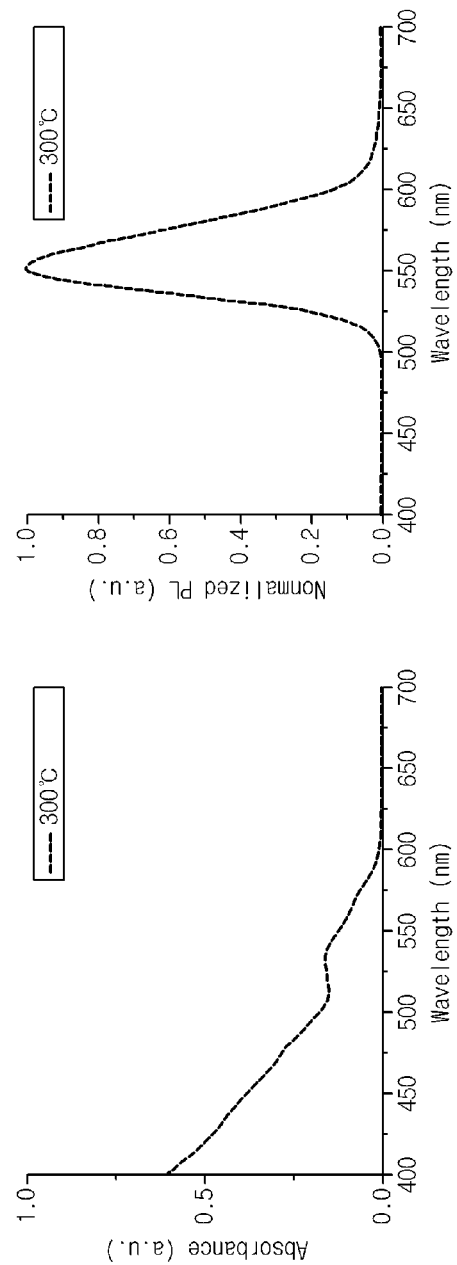

Experimental Example #5 was performed under the same condition of Experimental Example #1 except for the temperature condition. In Experimental Example #5, the reaction solution was heated up to about 300° C. and then cooled. The nano particle was obtained through Experimental Example #5. The diameter of the nano particle was about 6 nm. In the nano particle, the composition of Cd was about 16% and the composition of Zn was about 46%. In addition, the nano particle prepared according to Experimental Example #5 represented the absorbance and light emitting characteristics as shown in FIG. 9. In particular, the nano particle prepared according to Experimental Example #5 represented the wavelength of about 575 nm.

Experimental Example #6

Figure 10:
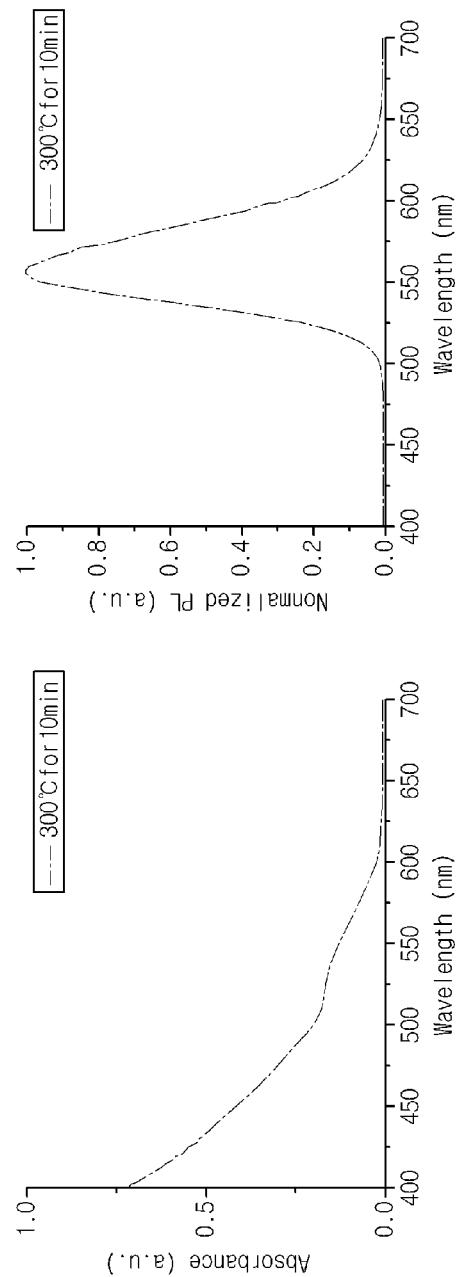

Experimental Example #6 was performed under the same condition of Experimental Example #1 except for the temperature condition. In Experimental Example #6, the reaction solution was heated up to about 300° C., maintained for about 10 minutes and then cooled to the normal temperature. The nano particle was obtained through Experimental Example #6. The diameter of the nano particle was about 7 nm. In the nano particle, the composition of Cd was about 8% and the composition of Zn was about 47%. In addition, the nano particle prepared according to Experimental Example #6 represented the absorbance and light emitting characteristics as shown in FIG. 10. In particular, the nano particle prepared according to Experimental Example #6 represented the wavelength of about 583 nm.

The invention claimed is:

1. A nano particle comprising:
a compound semiconductor including a cadmium (Cd) and a zinc (Zn),
wherein the nano particle has a diameter of about 2 nm to about 8 nm and converts a light having a wavelength of about 300 nm to about 400 nm into a light having a wavelength of about 500 nm to about 600 nm,
wherein the content of the cadmium is gradually reduced from a center of the nano particle to an outer portion of the nano particle,
wherein the content of the zinc is gradually increased from the center of the nano particle to the outer portion of the nano particle, and
wherein the composition of the cadmium is reduced from the center of the nano particle to the outer portion of the nano particle such that at least two inflection points can be formed.

2. The nano particle of claim 1, wherein the compound semiconductor includes a first group VI element and a second group VI element.

3. The nano particle of claim 2, wherein the first group VI element is selenium, and the second group VI element is sulfide.

4. A nano particle complex comprising:
a nano particle including a cadmium (Cd) and a zinc (Zn),
wherein the nano particle has a diameter of about 2 nm to about 8 nm and converts a light having a wavelength of about 300 nm to about 400 nm into a light having a wavelength of about 500 nm to about 600 nm,
wherein the content of the cadmium is gradually reduced from a center of the nano particle to an outer portion of the nano particle,
wherein the content of the zinc is gradually increased from the center of the nano particle to the outer portion of the nano particle, and
wherein the composition of the cadmium is reduced from the center of the nano particle to the outer portion of the nano particle such that at least two inflection points can be formed.

5. A method of fabricating a nano particle, the method comprising:
mixing a $Cd(OH)_2$ with a $Zn(OH)_2$;
reacting the $Cd(OH)_2$ with the $Zn(OH)_2$; and
forming a compound semiconductor including a Cd derived from the $Cd(OH)_2$ and a Zn derived from the $Zn(OH)_2$,
wherein the nano particle has a diameter of about 2 nm to about 8 nm and converts a light having a wavelength of about 300 nm to about 400 nm into a light having a wavelength of about 500 nm to about 600 nm,
wherein the content of the cadmium is gradually reduced from a center of the nano particle to an outer portion of the nano particle,
wherein the content of the zinc is gradually increased from the center of the nano particle to the outer portion of the nano particle, and
wherein the composition of the cadmium is reduced from the center of the nano particle to the outer portion of the nano particle such that at least two inflection points can be formed.

6. The method of claim 5, further comprising:
forming a reaction solution including the $Cd(OH)_2$ and the $Zn(OH)_2$; and
increasing a temperature of the reaction solution.

7. The method of claim 6, wherein the temperature of the reaction solution is increased in a range of about 50° C. to about 400° C.

8. The method of claim 6, wherein the reaction solution includes a nucleophilic catalyst.

9. The method of claim 8, wherein the nucleophilic catalyst is selected from the group consisting of amine and phosphine.

* * * * *